United States Patent
Sexton

(10) Patent No.: US 8,826,857 B2
(45) Date of Patent: Sep. 9, 2014

(54) PLASMA PROCESSING ASSEMBLIES INCLUDING HINGE ASSEMBLIES

(75) Inventor: Greg Sexton, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 454 days.

(21) Appl. No.: 13/315,929

(22) Filed: Dec. 9, 2011

(65) Prior Publication Data

US 2013/0126092 A1    May 23, 2013

Related U.S. Application Data

(60) Provisional application No. 61/562,124, filed on Nov. 21, 2011.

(51) Int. Cl.
| | |
|---|---|
| C23C 16/50 | (2006.01) |
| H01L 21/306 | (2006.01) |
| C23F 1/00 | (2006.01) |
| E05D 1/00 | (2006.01) |
| E05D 15/50 | (2006.01) |
| E05F 1/08 | (2006.01) |
| H01J 37/32 | (2006.01) |
| C23C 16/06 | (2006.01) |
| C23C 16/22 | (2006.01) |

(52) U.S. Cl.
CPC ....... H01J 37/3288 (2013.01); H01J 37/32513 (2013.01); H01J 37/32807 (2013.01)
USPC ........ 118/723 R; 156/345.1; 16/225; 16/230; 16/233; 16/238; 16/242; 16/243; 16/244; 16/302; 16/366

(58) Field of Classification Search
USPC .............. 118/723 R; 156/345.1; 16/225, 230, 16/233, 238, 242, 243, 244, 302, 366
See application file for complete search history.

(56) References Cited

U.S. PATENT DOCUMENTS

| | | | | |
|---|---|---|---|---|
| 3,641,973 | A | * | 2/1972 | Shrader ......................... 118/719 |
| 3,649,339 | A | * | 3/1972 | Smith ............................ 417/152 |
| 4,094,722 | A | * | 6/1978 | Yamamoto et al. ...... 156/345.35 |
| 4,252,595 | A | * | 2/1981 | Yamamoto et al. ...... 156/345.31 |

(Continued)

FOREIGN PATENT DOCUMENTS

| | | |
|---|---|---|
| JP | 2003-181087 A | 7/2003 |
| KR | 10-2001-0112324 A | 12/2001 |

(Continued)

OTHER PUBLICATIONS

Search Report and Written Opinion mailed Mar. 4, 2013 from Appln. No. PCT/US2012/063789.

*Primary Examiner* — Rudy Zervigon

(57) ABSTRACT

In one embodiment, a plasma processing assembly may include an upper process body coupled to a hinge body and a lower process body coupled to a base hinge member. The hinge body can be pivotally engaged with the base hinge member. A self locking latch can be pivotally engaged with the base hinge member. When the hinge body is rotated around the first axis of rotation, the protruding latch engagement member can contact the self locking latch and can rotate the self locking latch around the second axis of rotation opposite to the bias direction. The self locking latch can rotate around the second axis of rotation in the bias direction and can block the hinge body from rotating around the first axis of rotation.

16 Claims, 5 Drawing Sheets

(56) References Cited

U.S. PATENT DOCUMENTS

| | | | |
|---|---|---|---|
| 4,448,149 A * | 5/1984 | Brown et al. | 118/500 |
| 4,654,106 A * | 3/1987 | Davis et al. | 156/345.25 |
| 5,352,294 A * | 10/1994 | White et al. | 118/725 |
| 5,383,971 A * | 1/1995 | Selbrede | 118/728 |
| 5,518,593 A * | 5/1996 | Hosokawa et al. | 204/192.12 |
| 5,525,160 A * | 6/1996 | Tanaka et al. | 118/728 |
| 5,582,866 A * | 12/1996 | White | 427/248.1 |
| 5,900,103 A * | 5/1999 | Tomoyasu et al. | 156/345.44 |
| 6,050,446 A * | 4/2000 | Lei et al. | 220/819 |
| 6,095,083 A * | 8/2000 | Rice et al. | 118/723 I |
| 6,099,647 A * | 8/2000 | Yieh et al. | 118/697 |
| 6,264,788 B1 * | 7/2001 | Tomoyasu et al. | 156/345.43 |
| 6,267,821 B1 * | 7/2001 | Lu | 118/728 |
| 6,348,099 B1 * | 2/2002 | Xia et al. | 118/697 |
| 6,391,147 B2 * | 5/2002 | Imafuku et al. | 156/345.47 |
| 6,406,209 B1 * | 6/2002 | Liu et al. | 403/13 |
| 6,422,173 B1 * | 7/2002 | Nakajima | 118/723 I |
| 6,431,115 B2 * | 8/2002 | Komino et al. | 118/723 VE |
| 6,444,037 B1 * | 9/2002 | Frankel et al. | 118/715 |
| 6,495,233 B1 * | 12/2002 | Shmurun et al. | 428/64.1 |
| 6,517,634 B2 * | 2/2003 | Pang et al. | 118/715 |
| 6,544,380 B2 * | 4/2003 | Tomoyasu et al. | 156/345.51 |
| 6,558,506 B1 * | 5/2003 | Freeman et al. | 156/345.32 |
| 6,673,197 B2 * | 1/2004 | Penelon et al. | 156/345.38 |
| 6,776,848 B2 * | 8/2004 | Rosenstein et al. | 118/726 |
| 6,776,850 B2 * | 8/2004 | Liao et al. | 118/728 |
| 6,972,071 B1 * | 12/2005 | Tyler | 156/345.47 |
| 6,991,701 B2 * | 1/2006 | Takenaka et al. | 156/345.51 |
| 7,013,834 B2 * | 3/2006 | Tyler et al. | 118/723 E |
| 7,029,536 B2 * | 4/2006 | Hamelin et al. | 118/715 |
| 7,074,278 B2 * | 7/2006 | Nguyen et al. | 118/715 |
| 7,101,442 B2 * | 9/2006 | Choi et al. | 118/733 |
| 7,163,586 B2 * | 1/2007 | Christensen | 118/719 |
| 7,371,285 B2 * | 5/2008 | Rosenstein et al. | 118/715 |
| 7,416,633 B2 * | 8/2008 | Makino et al. | 156/345.27 |
| 7,572,337 B2 * | 8/2009 | Rocha-Alvarez et al. | 118/715 |
| 7,585,383 B2 * | 9/2009 | Oohirabaru et al. | 156/345.32 |
| 7,622,005 B2 * | 11/2009 | Balasubramanian et al. | 118/715 |
| 7,674,351 B2 * | 3/2010 | Makino et al. | 156/345.27 |
| 7,707,965 B2 * | 5/2010 | Yamashita | 118/723 MW |
| 7,828,928 B2 * | 11/2010 | Makino et al. | 156/345.51 |
| 7,879,181 B2 * | 2/2011 | Lee et al. | 156/345.31 |
| 7,964,058 B2 * | 6/2011 | Hamelin et al. | 156/345.27 |
| 8,202,575 B2 * | 6/2012 | Monsma et al. | 427/255.7 |
| 8,475,596 B2 * | 7/2013 | Pei | 118/728 |
| 8,480,850 B2 * | 7/2013 | Tyler et al. | 156/345.47 |
| 8,613,827 B2 * | 12/2013 | Tyler et al. | 156/345.45 |
| 8,668,775 B2 * | 3/2014 | Moshtagh et al. | 118/715 |
| 2001/0014268 A1 * | 8/2001 | Bryson et al. | 414/217 |
| 2001/0023744 A1 * | 9/2001 | Komino | 156/345 |
| 2001/0027843 A1 * | 10/2001 | Komino et al. | 156/345 |
| 2002/0000198 A1 * | 1/2002 | Ishikawa et al. | 118/715 |
| 2002/0007785 A1 * | 1/2002 | Gujer et al. | 118/500 |
| 2002/0088547 A1 * | 7/2002 | Tomoyasu et al. | 156/345.47 |
| 2002/0092144 A1 * | 7/2002 | Nguyen et al. | 29/25.01 |
| 2002/0108571 A1 * | 8/2002 | Black et al. | 118/715 |
| 2002/0117262 A1 * | 8/2002 | Pang et al. | 156/345.1 |
| 2002/0121241 A1 * | 9/2002 | Nguyen et al. | 118/715 |
| 2002/0121342 A1 * | 9/2002 | Nguyen et al. | 156/345.33 |
| 2002/0134310 A1 * | 9/2002 | Condrashoff et al. | 118/719 |
| 2003/0010451 A1 * | 1/2003 | Tzu et al. | 156/345.33 |
| 2003/0131794 A1 * | 7/2003 | Rosenstein et al. | 118/722 |
| 2003/0172872 A1 * | 9/2003 | Thakur et al. | 118/715 |
| 2003/0196760 A1 * | 10/2003 | Tyler et al. | 156/345.47 |
| 2004/0026372 A1 * | 2/2004 | Takenaka et al. | 216/71 |
| 2004/0118519 A1 * | 6/2004 | Sen et al. | 156/345.33 |
| 2004/0173162 A1 * | 9/2004 | Rosenstein et al. | 118/733 |
| 2005/0115675 A1 * | 6/2005 | Tzu et al. | 156/345.33 |
| 2005/0139160 A1 * | 6/2005 | Lei et al. | 118/715 |
| 2005/0193953 A1 * | 9/2005 | Makino et al. | 118/733 |
| 2005/0194093 A1 * | 9/2005 | Makino et al. | 156/345.27 |
| 2005/0211386 A1 * | 9/2005 | Hamelin et al. | 156/345.52 |
| 2005/0218114 A1 * | 10/2005 | Yue et al. | 216/59 |
| 2005/0263072 A1 * | 12/2005 | Balasubramanian et al. | 118/715 |
| 2005/0263248 A1 * | 12/2005 | Rocha-Alvarez et al. | 156/345.34 |
| 2005/0269031 A1 * | 12/2005 | Tyler et al. | 156/345.48 |
| 2006/0021573 A1 * | 2/2006 | Monsma et al. | 118/715 |
| 2006/0134919 A1 * | 6/2006 | Hamelin et al. | 438/706 |
| 2007/0095285 A1 * | 5/2007 | Thakur et al. | 118/715 |
| 2007/0095477 A1 * | 5/2007 | Arita et al. | 156/345.47 |
| 2008/0141942 A1 * | 6/2008 | Brown et al. | 118/723 R |
| 2009/0011120 A1 * | 1/2009 | Iwai | 427/58 |
| 2009/0078200 A1 * | 3/2009 | Lee et al. | 118/719 |
| 2009/0107403 A1 * | 4/2009 | Moshtagh et al. | 118/728 |
| 2009/0226633 A1 * | 9/2009 | LaFlamme et al. | 427/532 |
| 2010/0140223 A1 * | 6/2010 | Tyler et al. | 216/67 |
| 2010/0175620 A1 * | 7/2010 | Takeya et al. | 118/715 |
| 2010/0294199 A1 * | 11/2010 | Tran et al. | 118/723 R |
| 2011/0041769 A1 * | 2/2011 | Lee | 118/733 |
| 2011/0114020 A1 * | 5/2011 | Tzu et al. | 118/706 |
| 2012/0070581 A1 * | 3/2012 | Monsma et al. | 427/255.28 |
| 2013/0126092 A1 * | 5/2013 | Sexton | 156/345.1 |

FOREIGN PATENT DOCUMENTS

| | | |
|---|---|---|
| KR | 10-2008-0043732 A | 5/2008 |
| KR | 10-2009-0027915 A | 3/2009 |
| KR | 10-2010-0121986 A | 11/2010 |

* cited by examiner

PLASMA PROCESSING ASSEMBLIES INCLUDING HINGE ASSEMBLIES

CROSS-REFERENCE TO RELATED APPLICATIONS

This application claims the benefit of U.S. Provisional Application No. 61/562,124, filed Nov. 21, 2011, entitled "PLASMA PROCESSING ASSEMBLIES INCLUDING HINGE ASSEMBLIES." The entire content of said application is hereby incorporated by reference.

TECHNICAL FIELD

The present specification generally relates to plasma processing assemblies, and more specifically, relates to plasma processing assemblies comprising hinge assemblies.

BACKGROUND

Plasma processing assemblies can be utilized to etch material away from a substrate formed from, for example, a semiconductor or glass. Plasma processing assemblies may contain a vacuum chamber that encloses plasma processing gases, which can be ionized and transformed into plasma. For example a radio frequency source (RF source) can apply radio frequency energy (RF energy) to the process gas to generate the plasma. In some plasma processing assemblies, a plurality of electrodes and dielectric rings can be concentrically aligned to direct RF energy to desired portions of a substrate. Moreover, one electrode can be coupled to a lower process body and another electrode can be coupled to an upper process body. The lower process body and upper process body can be pivotally engaged with one another for relative rotational motion. For example, the upper process body may be periodically rotated away from the lower process body for maintenance and or cleaning of the lower process body. Such periodic maintenance can cause misalignment between the upper process body and the lower process body.

Accordingly, a need exists for additional plasma processing assemblies comprising hinge assemblies.

SUMMARY

In one embodiment, plasma processing assembly may include a lower process body, a base hinge member, a hinge body, and a self locking latch. The lower process body may include a lower vacuum chamber formed therein. The base hinge member can be mounted to the lower process body. The hinge body can be pivotally engaged with the base hinge member. The hinge body can be mounted to an upper process body. The base hinge member and the hinge body can rotate with respect to one another around a first axis of rotation such that motion of the upper process body is constrained by the base hinge member and the hinge. The hinge body may include a protruding latch engagement member. The self locking latch can be pivotally engaged with the base hinge member. The self locking latch and the base hinge member can rotate with respect to one another around a second axis of rotation. The self locking latch can be biased in a bias direction. When the hinge body is rotated around the first axis of rotation from a closed position and towards a locked position, the protruding latch engagement member can contact the self locking latch and can rotate the self locking latch around the second axis of rotation opposite to the bias direction. When the hinge body is rotated around the first axis of rotation into the locked position, the self locking latch can rotate around the second axis of rotation in the bias direction and can block the hinge body from rotating around the first axis of rotation into the closed position.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

FIG. 1 generally depicts one embodiment of a plasma processing assembly for etching materials from and/or depositing materials onto substrates. The plasma processing assembly generally comprises an upper process body pivotally engaged with a lower process body via a hinge assembly. According to the embodiments described herein, the hinge assembly generally comprises a base hinge member pivotally engaged with a hinge body and a self locking latch pivotally engaged with the base hinge member. Various embodiments of the plasma processing assembly and the operation of the plasma processing assembly will be described in more detail herein.

Figure 1A:
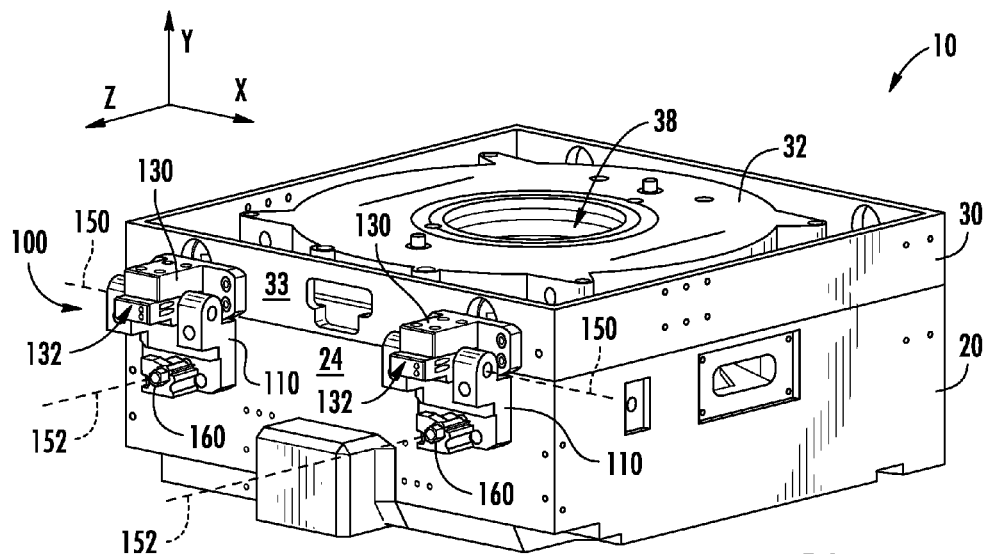
FIG. 1A schematically depicts a plasma processing assembly in a closed position according to one or more embodiments shown and described herein.
Figure 1B:
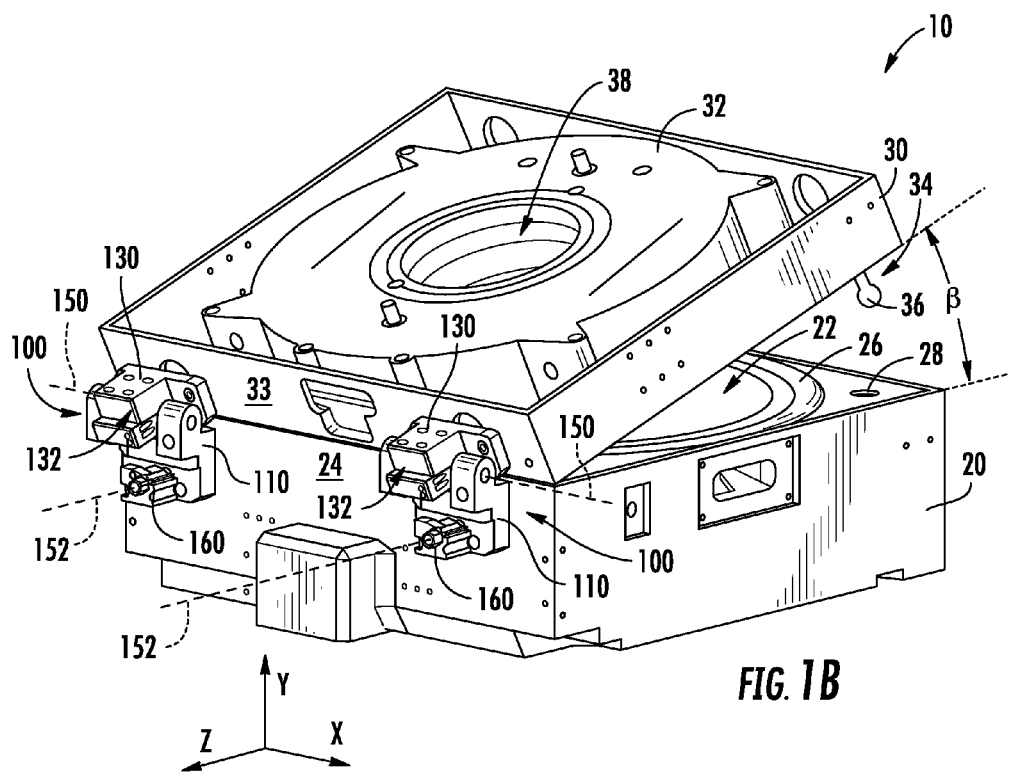
FIG. 1B schematically depicts a plasma processing assembly according to one or more embodiments shown and described herein.

Referring collectively to FIGS. 1A and 1B, the plasma processing assembly 10 comprises a lower process body 20 that has a lower vacuum chamber 22 formed therein for enclosing plasma processes. During plasma processes such as etching or deposition, the lower vacuum chamber 22 can enclose plasma processing gases, which may comprise halogens or halogen elements such as, for example, fluorine (F), chlorine (Cl), bromine (Br), iodine (I), and astatine (At). Moreover, specific process gases may include $CClF_3$, $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, and other gases capable of being ionized. The lower process body 20 can further comprise an O-ring 26 suitable to seal plasma processing gases within the lower vacuum chamber 22. Accordingly, the O-ring 26 can be concentric and adjacent with the lower vacuum chamber 22.

It is noted that, while the O-ring 26 is depicted in FIG. 1B as being seated in the lower process body 20, the O-ring 26 can be seated in the upper process body 30.

The plasma processing assembly 10 further comprises an upper process body 30 that cooperates with the lower process body 20 to seal the lower vacuum chamber 22. Specifically, the upper process body 30 comprises a chamber lid 32 that interlocks with the lower process body 20 to enable the lower vacuum chamber 22 to be maintained at a low pressure. In some embodiments, the chamber lid 32 of the upper process body 30 can form a seal with an O-ring 26 that is seated within the lower process body 20. For example, the chamber lid 32 can be brought into contact with the O-ring 26 (i.e., when the upper process body 30 is closed as is depicted in FIG. 1A). The upper process body 30 can cause an initial compression of the O-ring 26 sufficient to enable a vacuum to be pulled within the lower vacuum chamber 22, i.e., the weight of the upper process body 30 can compress the O-ring 26 and/or clamping device can be utilized to cause the initial compression. Then, the pressure within the vacuum chamber can be gradually decreased and the O-ring 26 can be gradually compressed. Specifically, the lower vacuum chamber 22 can be decreased to and maintained at a low pressure such as, for example, in the mTorr range, or about 100 mTorr to about 200 mTorr. Accordingly, the O-ring 26 can be configured such that a suitable seal is maintained to allow for the decrease of pressure within the lower vacuum chamber 22.

As is depicted in FIG. 1B, the lower process body 20 may comprise a pin accepting orifice 28 and the upper process body 30 may include an alignment pin 34. The pin accepting orifice 28 and the alignment pin 34 can be configured to align the upper process body 30 with the lower vacuum chamber 22 of the lower process body 20. For example, the alignment pin 34 may comprise a spherical member 36 and the pin accepting orifice 28 can have a circular cross section, such that the dimensions of the spherical member 36 and the pin accepting orifice 28 are within a relatively small radial clearance along the X-Z plane such as, for example, less than about 0.002 inches (about 50 microns), in one embodiment less than about 0.001 inches (about 25 microns), or in another embodiment from about 0.0003 inches (about 7 microns) to about 0.0008 inches (about 20 microns). It is noted that, while the alignment pin 34 is depicted as being substantially cylindrical and the pin accepting orifice 28 is depicted as being substantially circular in FIG. 1B, the alignment pin 34 and the pin accepting orifice 28 can be shaped in any way suitable for interlocking and aligning the upper process body 30 with respect to the lower process body 20. Furthermore, it is noted that the upper process body 30 may include an orifice for alignment and the lower process body 20 may include a corresponding pin for alignment.

Referring collectively to FIGS. 1A and 1B, the upper process body 30 may optionally comprise an actuator orifice 38 formed through the upper process body 30 for coupling with a substrate handling actuator (not depicted). The substrate handling actuator can be configured to automatically load and unload substrates for plasma processing. Moreover, the substrate handling actuator can be utilized to ensure proper alignment of electrodes and dielectric rings for bevel etching operations. However, it is noted that the embodiments described herein can be utilized with or without an actuator orifice 38.

Figure 2:
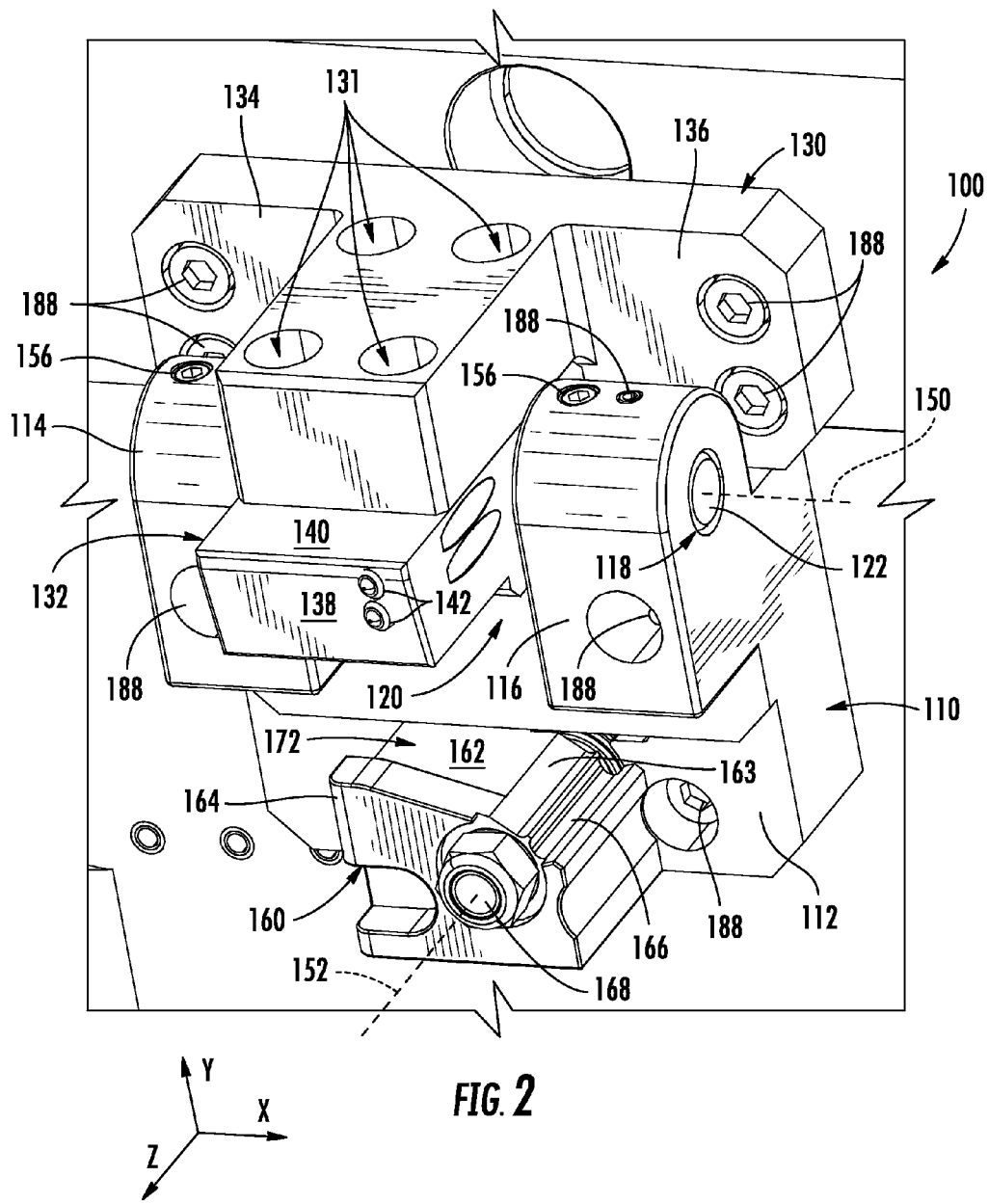
FIG. 2 schematically depicts a hinge assembly according to one or more embodiments shown and described herein.

Referring now to FIG. 2, a hinge assembly 100 for providing pivotal motion and a self locking mechanism to the plasma processing assembly 10 is schematically depicted. The hinge assembly 100 comprises a base hinge member 110 pivotally engaged with a hinge body 130. The base hinge member 110 comprises a mounting platform 112 for coupling with lower process body 20 (FIGS. 1A and 1B). In one embodiment, the base hinge member 110 can further comprise a first lobe member 114 and a second lobe member 116. Each of the first lobe member 114 and the second lobe member 116 can be joined with the mounting platform 112 and extend vertically (positive Y-direction) from the mounting platform 112. In some embodiments, the first lobe member 114 and the second lobe member 116 can be laterally offset along the positive Z-direction from the mounting platform 112. The first lobe member 114 and the second lobe member 116 can be laterally offset from one another along the X-axis and demarcate a hinge body accepting opening 120 there between.

An elongate slot 118 can be formed through each of the first lobe member 114 and the second lobe member 116 and aligned with a first axis of rotation 150. The elongate slot 118 can have a substantially circular cross-section that is elongated in the vertical direction (along the Y-axis). The elongate slot 118 can be configured to cooperate with a hinge pin 122 to allow pivotal motion and vertical adjustment. In one embodiment, the hinge pin 122 can be substantially cylindrical. The hinge pin 122 can be inserted into the elongate slot 118 substantially in alignment with the first axis of rotation 150. Accordingly, the elongate slot 118 can constrain the hinge pin 122 and allow the hinge pin 122 to slide vertically (along the Y-axis) within the elongate slot 118. For example, the elongate slot 118 can be shaped to allow the hinge pin 122 to slide towards the lower process body 20 as vacuum is pulled and the O-ring 26 is compressed. Similarly, the elongate slot 118 can be shaped to allow the hinge pin 122 to slide away from the lower process body 20 as vacuum is released and the O-ring 26 expands.

The hinge body 130 is configured to engage with the upper process body 30 (FIGS. 1A and 1B). In one embodiment, the hinge body 130 comprises a first mounting flange 134 and a second mounting flange 136 for mounting the hinge body 130. The hinge body 130 further comprises a protruding latch engagement member 132 for automatically engaging with a self locking latch 160, as is described in greater detail below. The protruding latch engagement member 132 is a substantially elongate member that extends away (positive Z-direction in the closed position depicted in FIG. 2) from the hinge body 130. The protruding latch engagement member 132 forms a latch deflecting surface 138 and a locking surface 140 that are configured to cooperate with the self locking latch 160.

Specifically, when in the closed position depicted in FIG. 2, the locking surface 140 faces substantially vertically, i.e., the locking surface 140 has a surface normal substantially aligned with the positive Y-direction. Also, when in the closed position, the latch deflecting surface 138 faces substantially outward, i.e., the latch deflecting surface 138 has a surface normal substantially aligned with the positive Y-direction. It is noted that, while the protruding latch engagement member 132 is depicted as being coupled to the hinge body 130 by alignment fasteners 131 (e.g., screws, bolts, and the like), the protruding latch engagement member 132 can be coupled to the hinge body 130 using any known fastening system or the protruding latch engagement member 132 can be integral with the hinge body 130.

The protruding latch engagement member 132 can further comprise one or more detents 142 that temporarily retain the self locking latch 160 in a release position relative to the protruding latch engagement member 132, as is explained in greater detail below. The detents 142 can be coupled to the protruding latch engagement member 132 and extend out of the latch deflecting surface 138. In one embodiment, each detent 142 can include a biased bearing or any other biased mechanism that can be selectively released.

Referring still to FIG. 2, the hinge assembly 100 further comprises a self locking latch 160 pivotally engaged with the base hinge member 110 for automatically locking the hinge assembly 100. Specifically, the self locking latch 160 can be pivotally engaged with the base hinge member 110 such that the self locking latch 160 rotates around a second axis of rotation 152. As is schematically depicted in FIG. 2, the second axis of rotation 152 is substantially orthogonal to the first axis of rotation 150.

The self locking latch 160 is biased to ensure automatic locking. Specifically, the self locking latch 160 is biased against rotation in one direction around the second axis of rotation 152. In one embodiment, the self locking latch 160 can be pivotally engaged to the mounting platform 112 of the base hinge member 110 with a latch fastener 168 coincident with the second axis of rotation 152. The latch fastener 168 can operably couple a torsion member (e.g., a spring) to the self locking latch 160 such that the self locking latch 160 is biased against counter-clockwise rotation around the second axis of rotation 152. It is noted that the self locking latch 160 can be biased to any rotation suitable for automatic locking.

In one embodiment, the self locking latch 160 comprises a recessed surface 162 and an angled ridge 164, which cooperate to demarcate a hinge locking cavity 172. When in the closed position, the angled ridge 164 extends vertically away (along the positive Y-direction) from the recessed surface 162. The angled ridge 164 can gradually increase in height along an incline with respect to the recessed surface 162 of the self locking latch 160. Specifically, the angled ridge 164 can be inclined such that the angled ridge 164 extends further away from the recessed surface 162 as the angled ridge 164 extends laterally (along the negative X-direction). However, it is noted that the angled ridge 164 can be inclined in any direction.

The self locking latch 160 may further comprise a latch opening groove 166 formed adjacent to the recessed surface 162 for temporarily engaging with the one or more detents 142 of the protruding latch engagement member 132. It is noted that, while the latch opening groove 166 is depicted as an elongate channel extending through the self locking latch 160, the latch opening groove 166 can be any feature formed in the latch suitable to temporarily engage with a detent 142. In some embodiments, the self locking latch 160 may further comprise a beveled surface 163 located between the recessed surface 162 and the latch opening groove 166. The beveled surface 163 can be pitched at any angle suitable to provide further clearance to the latch opening groove 166 as compared to the recessed surface 162.

Referring collectively to FIGS. 1A and 2, the hinge assembly 100 can be fastened to the lower process body 20 and upper process body 30 by fasteners 188 to constrain the pivotal motion between the lower process body 20 and upper process body 30. The fasteners 188 can be any device suitable couple the hinge assembly 100 to the lower process body 20 and upper process body 30, such as, for example, threaded fasteners, welds, rivets, and the like.

In one embodiment, the base hinge member 110 can be fastened to the lower process body 20. The hinge pin 122 can be received within the elongate slot 118 of the base hinge member 110. A fastener 188 such as a pin can be engaged with the base hinge member 110 and the hinge pin 122. Accordingly, the hinge pin 122 can be held within the elongate slot 118 of the base hinge member 110, while allowing the hinge pin 122 to move within the elongate slot 118. Specifically, in the embodiment depicted in FIG. 2, hinge pin 122 lateral motion substantially in line with the X-axis and rotational motion around the first axis of rotation 150 can be mitigated. Yet, hinge pin 122 vertical motion substantially in line with the Y-axis can be permitted to the extent of the elongate slot 118.

The hinge body 130 can be pivotally engaged with the hinge pin 122 to allow relative rotational motion with respect to the base hinge member 110. Specifically, the hinge body 130 can surround and rotate around the hinge pin 122 and the first axis of rotation 150. Accordingly, the hinge body 130 is sized such that it can be received within the hinge body accepting opening 120 of the base hinge member 110. Specifically, the hinge body 130 can have a smaller dimension than the distance between the first lobe member 114 and the second lobe member 116 of the base hinge member 110, as measured along the first axis of rotation 150.

In some embodiments, alignment between the lower process body 20 and the upper process body 30 can be adjusted. Specifically, the portion of the hinge body 130 that is engaged with the hinge pin 122 and the portion of the hinge body 130 that is engaged with the upper process body 30 can be configured for relative motion. In one embodiment, the hinge body 130 may be formed from two pieces that are coupled together via the alignment fasteners 131. Accordingly, during initial assembly, the upper process body 30 can be coupled with one portion of the hinge body 130 and the lower process body 20 can be coupled to the remainder of the hinge assembly 100 before the upper process body 30 and the lower process body 20 are fastened to one another. Thus, the upper process body 30 and the lower process body 20 can be aligned prior to full assembly of the hinge body 130 and, thus, the hinge assembly 100. For example, the alignment pin 34 and pin accepting orifice 28 (FIG. 1B) can be interlocked to ensure proper alignment between the upper process body 30 and the lower process body 20, prior to assembling the hinge body 130 with the alignment fasteners 131.

Referring again to FIG. 2, the base hinge member 110 can include set screws 156 for adjusting the compression on the O-ring 26 (FIG. 1B) for initial pump down of the lower vacuum chamber 22 to vacuum pressure. Specifically, the first lobe member 114 and the second lobe member 116 can each be threadingly engaged with a set screw 156. The set screws 156 can travel through the first lobe member 114 and the second lobe member 116 and into the elongate slot 118. Accordingly, the set screws 156 can limit the travel of the hinge pin 122 within the elongate slot 118 such as, for example, in the vertical direction (along the Y-axis). In some embodiments, the set screws 156 are coated with a thread lock coating such as, for example, a polymer, a methacrylate-based adhesive, and the like. Alternatively or additionally, the set screws 156 can be coupled to devices that prevent rotation such as, for example, lock washers, locknuts, safety wires, and the like. It is noted that, while the set screws 156 are depicted as flat tip screws in FIG. 2, the set screws 156 can be any fastener suitable to adjust the travel of the hinge pin 122 within the elongate slot 118.

Referring collectively to FIGS. 1A and 1B, the base hinge member 110 can be fastened to the lower process body 20 and in contact with an outer surface 24 of the lower process body 20. The hinge body 130 can be fastened to the upper process body 30 and in contact with an outer surface 33 of the upper process body 30. Accordingly, the lower process body 20 and the upper process body 30 can be pivotally engaged and capable of relative rotational motion with respect to the first axis of rotation 150. In some embodiments, the upper process body 30 of the plasma processing assembly 10 can be balanced such that the upper process body 30 automatically rotates to the closed position (FIG. 1A) when the upper process body 30 is rotated to an angle less than a balance angle β. For example, if the plasma processing assembly 10 is in its normal operating position as depicted in FIG. 1A, the upper process body 30 can be urged into a rotation around the first axis of rotation 150. If the upper process body 30 is not rotated beyond the balance angle β and the urging force is ceased, the upper process body 30 can be returned to the closed position (FIG. 1A) such as, for example, according to gravity acting upon the plasma processing assembly 10.

Figure 5A:
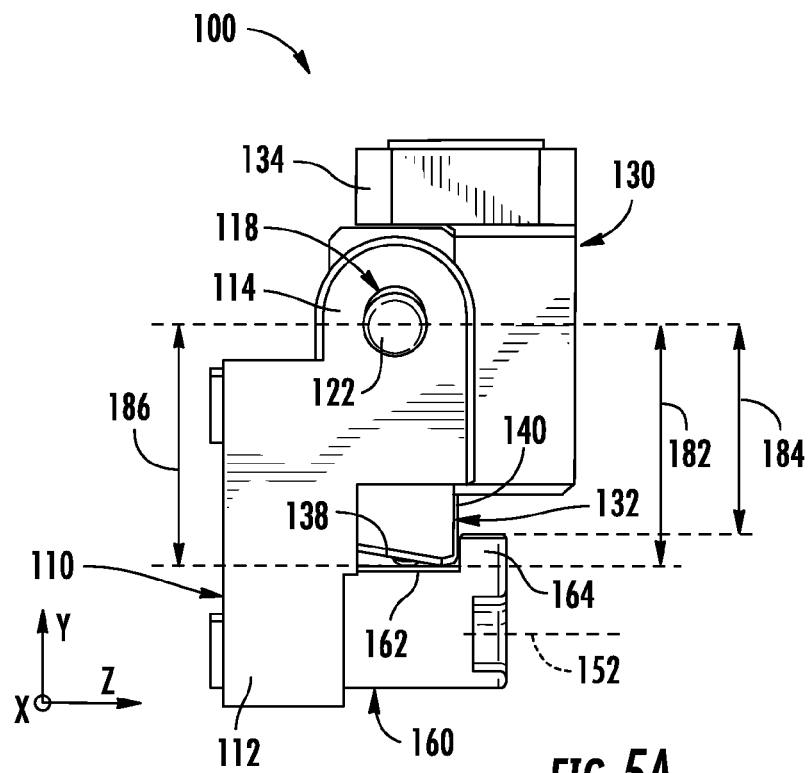
FIGS. 5A and 5B schematically depict a hinge assembly in a locked position according to one or more embodiments shown and described herein.
Figure 5B:
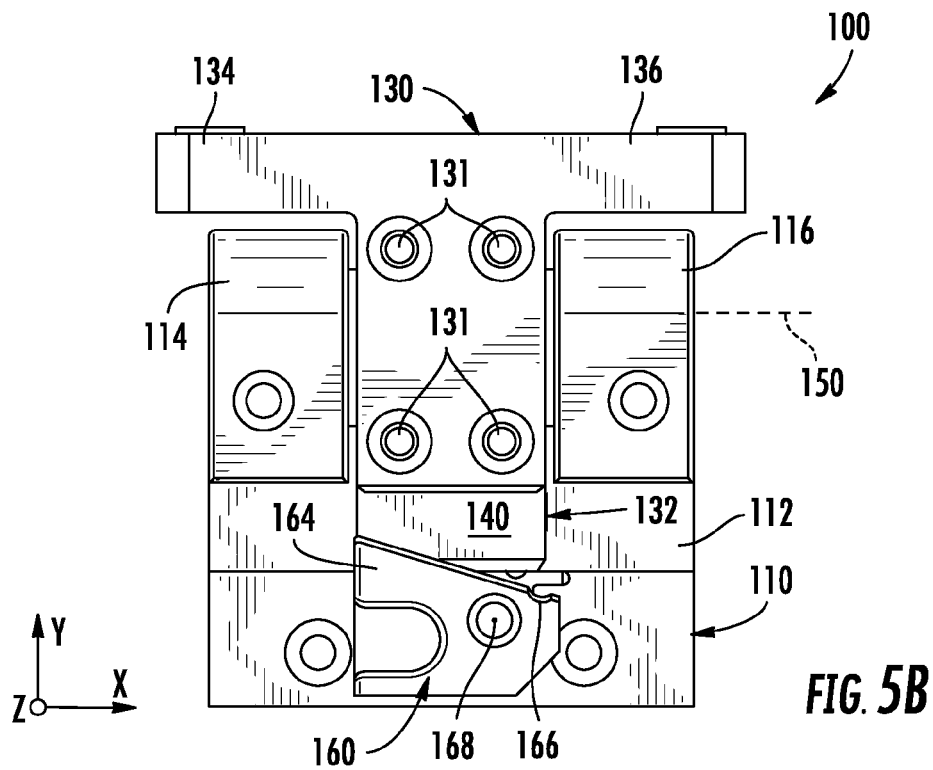

Similarly, with reference to FIGS. 1B, 5A and 5B, the upper process body 30 of the plasma processing assembly 10 can be balanced such that the upper process body 30 automatically rotates to the locked position (FIGS. 5A and 5B) when the upper process body 30 is rotated to an angle greater than a balance angle β. For example, if the plasma processing assembly 10 is in its normal operating position as depicted in FIG. 1B, the upper process body 30 can be urged into a rotation around the first axis of rotation 150. If the upper process body 30 is rotated beyond the balance angle β and the urging force is ceased, the upper process body 30 can automatically transition to the locked position (FIGS. 5A and 5B) such as, for example, according to gravity acting upon the plasma processing assembly 10. The balance angle β can be any angle less than about 60° (about 1.05 radians) such as, for example, in one embodiment less than about 45° (about 0.79 radians) or in another embodiment less than about 30° (about 0.52 radians).

Figure 3A:
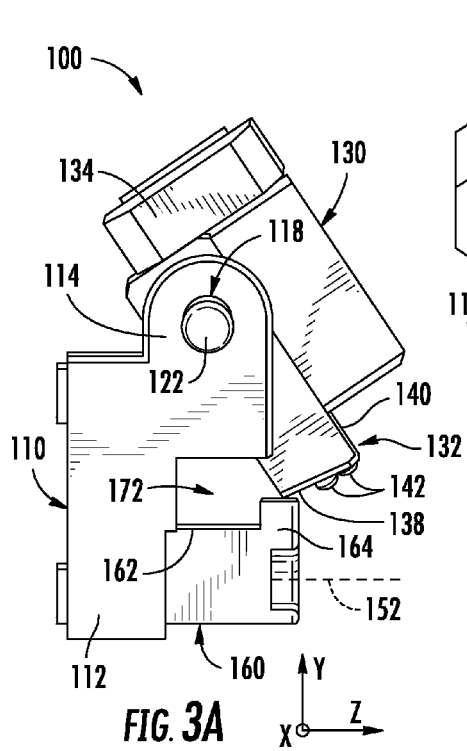
FIGS. 3A and 3B schematically depict a hinge assembly in an initial contact point according to one or more embodiments shown and described herein.
Figure 3B:
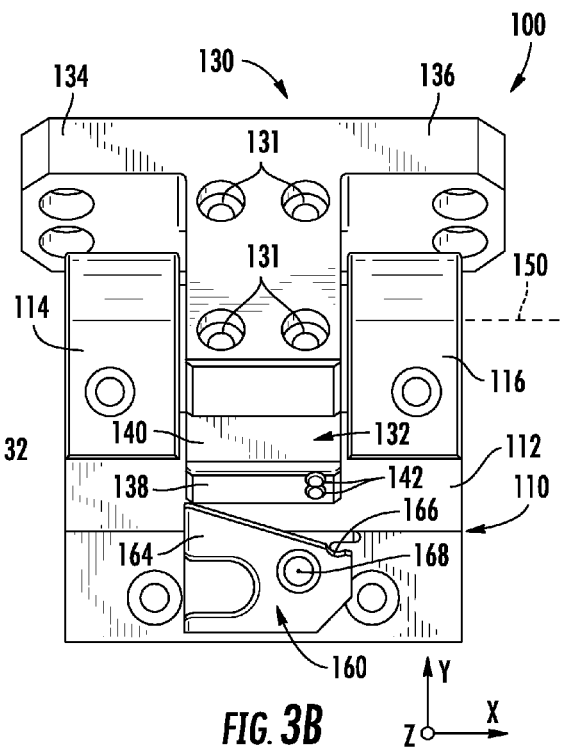

Referring now to FIGS. 3A and 3B, the hinge body 130 can be rotated with respect to the base hinge member 110 around the first axis of rotation 150. In one embodiment, the latch deflecting surface 138 of the protruding latch engagement member 132 can be urged into contact with the angled ridge 164 of the self locking latch 160 prior to the balance angle β. Accordingly, after contact with the angled ridge 164, the protruding latch engagement member 132 can counteract any bias applied to the self locking latch 160.

Figure 4A:
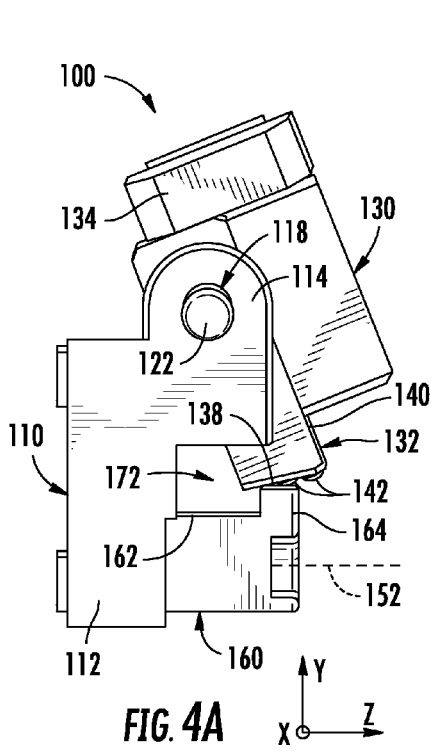
FIGS. 4A and 4B schematically depict a hinge assembly according to one or more embodiments shown and described herein.
Figure 4B:
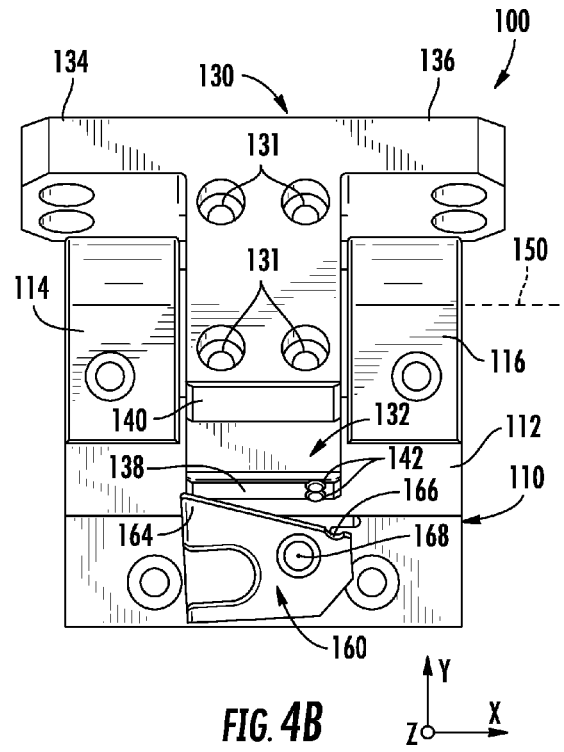

Referring now to FIGS. 4A and 4B, as the hinge body 130 is urged beyond the initial contact point (FIGS. 3A and 3B), rotation of the hinge body 130 with respect to the first axis of rotation 150 can cause the self locking latch 160 to rotate around the second axis of rotation 152. In one embodiment, as the protruding latch engagement member 132 is urged beyond the balance angle β, the latch deflecting surface 138 slides along the angled ridge 164 substantially along the negative Z-direction. Accordingly, the protruding latch engagement member 132 can overcome the bias applied to the self locking latch 160. Continued rotation of the hinge body 130 can clear a path for the protruding latch engagement member 132 to enter the hinge locking cavity 172. After the protruding latch engagement member 132 is rotated into the hinge locking cavity 172, the protruding latch engagement member 132 can release the angled ridge 164 of the self locking latch 160.

Once released, the self locking latch 160 can constrain the protruding latch engagement member 132 in a locked position, as depicted in FIGS. 5A and 5B. Specifically, the bias applied to the self locking latch 160 can maintain the self locking latch 160 in the locked position. When in the locked position, the angled ridge 164 of the self locking latch 160 cooperates with the locking surface 140 of the protruding latch engagement member 132 to limit rotational motion of the hinge assembly 100 with respect to the first axis of rotation 150. The hinge body 130 can be prevented from rotating around the first axis of rotation 150 towards the closed position (FIG. 1A), by an interaction between the locking surface 140 and the angled ridge 164 of the self locking 160. Accordingly, when the locking surface 140 of the protruding latch engagement member 132 contacts the angled ridge 164 of the self locking 160, the hinge assembly 100 can be confined to the locked position.

Referring now to FIG. 5A, when in the locked position, the recessed surface 162 of the self locking latch 160 is offset from the center of the hinge pin 122 along the Y-axis by a recess distance 182. A portion of the angled ridge 164 of the self locking latch 160 is offset from the center of the hinge pin 122 along the Y-axis by a ridge distance 184. A portion of the protruding latch engagement member 132 such as, for example, the lowest portion of the locking surface 140 with respect to the Y-axis, when in the locked position, is offset from the center of the hinge pin 122 along the Y-axis by a protrusion distance 186. In one embodiment, the recess distance 182 can be greater than or equal to the protrusion distance 186 and the ridge distance 184 can be less than the protrusion distance 186. In some embodiments, the latch deflecting surface 138 of the protruding latch engagement member 132 can be inclined. Specifically, when in the locked position, the outer end of the latch deflecting surface 138 (nearest to the angled ridge 164) is closest to the recessed surface 162 and the latch deflecting surface 138 gradually moves away from the recessed surface 162 as it moves away from the angled ridge 164.

Figure 6A:
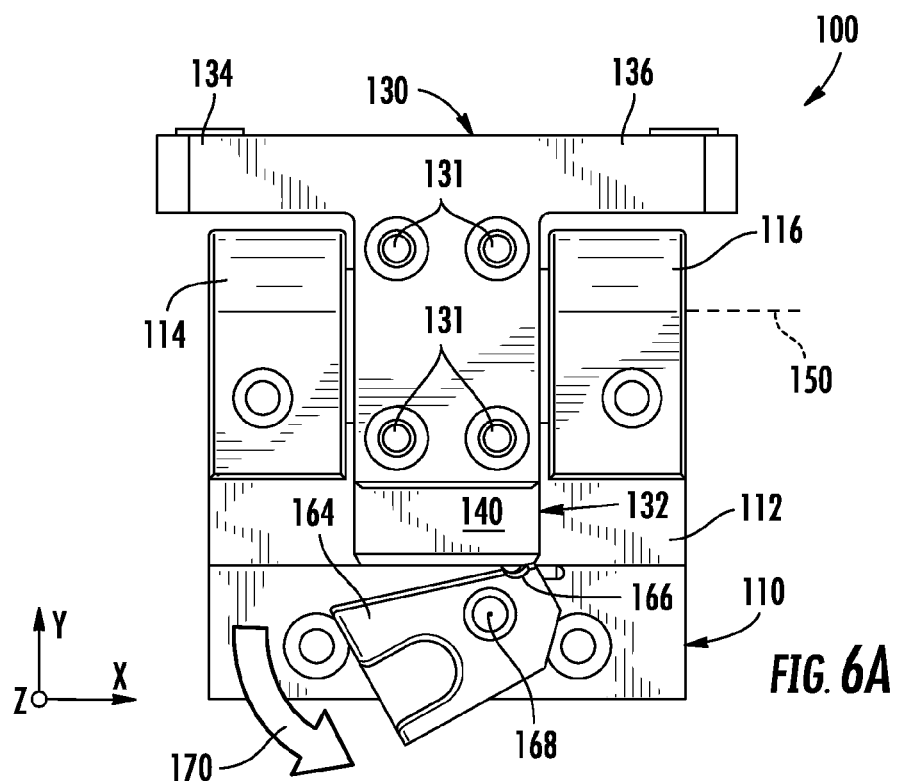
FIGS. 6A and 6B schematically depict a hinge assembly in a release position according to one or more embodiments shown and described herein.
Figure 6B:
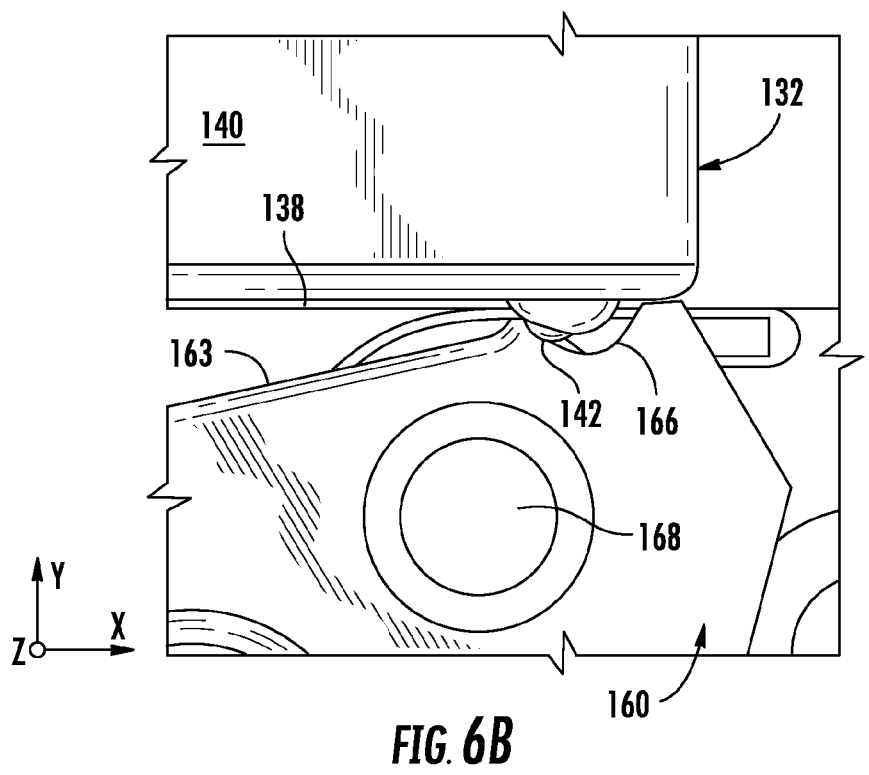

Accordingly, when in the locked position, the hinge assembly 100 can be prevented from returning to the closed position. Referring now to FIGS. 6A and 6B, which depict a release position, the self locking latch 160 can be rotated in a release direction 170 in opposition to the bias applied to the self locking latch 160. As the self locking latch 160 is rotated in the release direction 170, the detents 142 of the protruding latch engagement member 132 can slide along the self locking latch 160 towards the latch opening groove 166. For example, the detents 142 can slide along the recessed surface 162 and the beveled surface 163. The detents 142 can be urged into the latch opening groove 166 by applying a sufficient amount of force to overcome the bias of the detents 142, i.e., the detents 142 retract. Once detents 142 are received by the latch opening groove 166, the detents 142 can return to their biased position, i.e., the detents 142 extend. Accordingly, the detents 142 can engage the latch opening groove 166 and hold the self locking latch 160 in the release position. Once in the release position, the hinge assembly 100 can be rotated into the closed position. Specifically, the angled ridge 164 of the self locking latch 160 can be held clear of the locking surface 140 of the protruding latch engagement member 132 as the detents 142 slide along the latch opening groove 166. Moreover, once the hinge body 130 is free from the self locking latch 160, the detents 142 can disengage the latch opening groove 166 and allow the self locking latch 160 to rotate around the second axis of rotation 152 according to the applied bias. Thus, when the plasma processing assembly 10 is returned to the closed position, the self locking latch 160 can automatically reset.

It should now be understood that the embodiments described herein relate a plasma processing assembly having an upper process body that can automatically lock in an open position. Specifically, a self locking latch can be biased to enable the automatic locking of a hinge assembly in a locked position (e.g., open for maintenance), and automatic resetting of the latch of the hinge assembly when the upper processing body is transitioned to a closed position. Moreover, the hinge assembly can be configured to include alignment features that can be set during initial manufacture of the plasma processing assembly.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Furthermore, it is noted that directional references such as, for example, upper, lower, vertical, lateral and the like are made herein with reference to an XYZ coordinate system. The directional references have been provided for clarity and without limitation. Specifically, it is noted such directional references are made with respect to the XYZ coordinate system depicted in FIGS. 1A-6B. Thus, the directions may be reversed or oriented in any direction by making corresponding transformations to the provided coordinate system with respect to the structure to extend the examples described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A plasma processing assembly comprising:
   a lower process body comprising a lower vacuum chamber formed therein;
   a base hinge member mounted to the lower process body;
   a hinge body pivotally engaged with the base hinge member and mounted to an upper process body, wherein the base hinge member and the hinge body rotate with respect to one another around a first axis of rotation such that motion of the upper process body is constrained by the base hinge member and the hinge body, and wherein the hinge body comprises a protruding latch engagement member;
   a self locking latch pivotally engaged with the base hinge member, wherein the self locking latch and the base hinge member rotate with respect to one another around a second axis of rotation and the self locking latch is biased in a bias direction, and wherein:
      when the hinge body is rotated around the first axis of rotation from a closed position and towards a locked position, the protruding latch engagement member contacts of the self locking latch and rotates the self locking latch around the second axis of rotation opposite to the bias direction; and
      when the hinge body is rotated around the first axis of rotation into the locked position, the self locking latch rotates around the second axis of rotation in the bias direction and blocks the hinge body from rotating around the first axis of rotation into the closed position.

2. The plasma processing assembly of claim 1, wherein the base hinge member comprises a mounting platform that is coupled to the lower process body and one or more lobe members that extend away from the mounting platform.

3. The plasma processing assembly of claim 2, further comprising an elongate slot and a hinge pin, wherein the elongate slot is formed in at least one of the lobe members, and the hinge pin is inserted in the elongate slot substantially in alignment with the first axis of rotation.

4. The plasma processing assembly of claim 3, wherein the hinge body surrounds and rotates around the hinge pin.

5. The plasma processing assembly of claim 4, wherein the hinge body is located between two of the lobe members.

6. The plasma processing assembly of claim 3, wherein the hinge pin fastened within the elongate slot and slides vertically within the elongate slot.

7. The plasma processing assembly of claim 3, further comprising a set screw, wherein the set screw is engaged with one of the lobe members and contacts the hinge pin within the elongate slot.

8. The plasma processing assembly of claim 1, wherein the second axis of rotation is substantially orthogonal to the first axis of rotation.

9. The plasma processing assembly of claim 1, wherein the self locking latch comprises a recessed surface and an angled ridge, wherein the recessed surface and the angled ridge demarcate a hinge locking cavity.

10. The plasma processing assembly of claim 9, wherein the protruding latch engagement member comprises a detent and the self locking latch comprises a latch opening groove, such that when the self locking latch is rotated around the second axis of rotation from the closed position and towards a release position, the detent of the protruding latch engagement member engages the latch opening groove of the self locking latch and holds the self locking latch in the release position.

11. The plasma processing assembly of claim 10, wherein when the hinge body is rotated around the first axis of rotation away from the release position and towards the closed position, the detent of the protruding latch engagement member disengages the latch opening groove of the self locking latch and the self locking latch rotates around the second axis of rotation in the bias direction.

12. The plasma processing assembly of claim 1, wherein the upper process body is balanced such that when the upper process body is rotated around the first axis of rotation to an angle less than a balance angle, measured with respect to the lower process body, the upper process body automatically rotates to the closed position.

13. The plasma processing assembly of claim 1, wherein the upper process body is balanced such that when the upper process body is rotated around the first axis of rotation to an angle greater than a balance angle, measured with respect to the lower process body, the upper process body automatically rotates to the locked position.

14. The plasma processing assembly of claim 13, wherein the balance angle is less than about 60° (about 1.05 radians).

15. The plasma processing assembly of claim 1, further comprising an O-ring seated in the upper process body or the lower process body, wherein when in the closed position, the upper process body interlocks with the lower process body and the O-ring to seal the lower vacuum chamber.

16. The plasma processing assembly of claim 1, wherein the upper process body comprises an alignment pin and the lower process body comprises a pin accepting orifice, and when in the closed position, the alignment pin and the pin accepting orifice interlock to align the upper process body with respect to the lower process body.

* * * * *

UNITED STATES PATENT AND TRADEMARK OFFICE
CERTIFICATE OF CORRECTION

| | | |
|---|---|---|
| PATENT NO. | : 8,826,857 B2 | Page 1 of 1 |
| APPLICATION NO. | : 13/315929 | |
| DATED | : September 9, 2014 | |
| INVENTOR(S) | : Greg Sexton | |

It is certified that error appears in the above-identified patent and that said Letters Patent is hereby corrected as shown below:

In the Specification

Column 8,
Line 1:            After "locking", insert --latch--

Column 8,
Line 4:            After "locking", insert --latch--

Signed and Sealed this
Third Day of February, 2015

Michelle K. Lee
*Deputy Director of the United States Patent and Trademark Office*